United States Patent [19]

Beaulieu et al.

[11] Patent Number: 5,101,226
[45] Date of Patent: Mar. 31, 1992

[54] DISTANCE AND TILT SENSING APPARATUS

[75] Inventors: David R. Beaulieu, Wilmington; John D. Wallace, Newburyport, both of Mass.

[73] Assignee: General Signal Corporation, Stamford, Conn.

[21] Appl. No.: 601,412

[22] Filed: Oct. 22, 1990

[51] Int. Cl.⁵ .............................. G03B 27/52
[52] U.S. Cl. ............................ 355/53; 355/55
[58] Field of Search .............. 355/43, 45, 53, 77, 355/55; 356/400, 401, 375, 376, 152, 150; 250/201, 204

[56] References Cited

U.S. PATENT DOCUMENTS

| | | | |
|---|---|---|---|
| 4,504,144 | 3/1985 | Trost | 355/53 X |
| 4,558,949 | 12/1985 | Uehara et al. | 356/400 |
| 4,650,983 | 3/1987 | Suwa | 250/204 |
| 4,801,977 | 1/1989 | Ishizaka et al. | 355/53 X |
| 4,999,669 | 3/1991 | Sakamoto et al. | 355/53 |

*Primary Examiner*—L. T. Hix
*Assistant Examiner*—D. Rutledge
*Attorney, Agent, or Firm*—Henry D. Pahl, Jr.

[57] ABSTRACT

In the distance and tilt sensing apparatus disclosed herein, an image of a light source is projected by a lens obliquely onto a surface to be sensed. A ring reticle is interposed in the optical path between the light source and the lens at a distance from the lens substantially equal to its focal length. A second lens projects a remote image of the first object image onto a detector. The light projected from the second lens is split into two paths. An aperture reticle is interposed in one of the paths at a distance from the second lens substantially equal to its focal length, an image of the center of the ring reticle being formed on the aperture reticle. A position responsive optical detector aligned with the aperture reticle senses the position of the image of the center of the ring reticle relative to the center of the aperture and that position is indicative of the tilt of the surface around an axis essentially perpendicular to the axis of the incident light.

8 Claims, 1 Drawing Sheet

DISTANCE AND TILT SENSING APPARATUS

BACKGROUND OF THE INVENTION

The present invention relates to a combined distance and tilt sensing apparatus which is useful in the microlithographic forming of circuit patterns on the surface of a semiconductor wafer during the manufacture of integrated circuits.

Microlithographic techniques are widely used for forming circuit patterns on a resist-coated semiconductor wafer. As circuit details become increasingly smaller in dimension, more stringent requirements are placed on the required alignment of the wafer surface with the focal plane of the microlithographic projection lens. Not only is it important to control the distance of the wafer surface from the lens but it is also becoming increasingly important to level the surface of the wafer with respect to the lens' axis. Further, such leveling is preferably performed at each image site on the wafer since the surface of the wafer itself may not be flat within the tolerances required. While various independent optical systems have been devised for separately measuring distance to a wafer surface and its local tilt, these separate systems have not been readily applicable to microlithographic projector designs where the projection lens must extend into close proximity with the wafer surface.

Among the several objects of the present invention may be noted the provision of novel tilt sensing apparatus; the provision of such apparatus which combines tilt sensing and distance measurement; the provision of such apparatus which can be utilized in conjunction with a microlithographic projection lens which extends close to the surface of a wafer being printed; the provision of such apparatus which is highly accurate; the provision of such apparatus which can operate in real time during the manufacture of integrated circuits; the provision of such apparatus which is highly reliable and which is of relatively simple and inexpensive construction. Other objects and features will be in part apparent and in part pointed out hereinafter.

SUMMARY OF THE INVENTION

In the combined distance and tilt sensing apparatus of the present invention, an image of an optical source object is projected by a lens onto a surface to be sensed at a shallow angle of incidence. A ring reticle is interposed in the optical path between the source object and the lens at a distance from the lens substantially equal to its focal length. A second lens projects a remote image of the first object image onto a detector. The light projected from the second lens is split into two paths and an aperture is interposed in one of the paths at a distance from the second lens which is substantially equal to its focal length, an image of the ring reticle being formed thereby on the aperture. A position-responsive detector with its center aligned with the center of the aperture senses the position of the image of the center of the ring reticle relative to the center of the aperture and that position is indicative of the tilt of the surface about an axis essentially perpendicular to the axis of the incident light.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
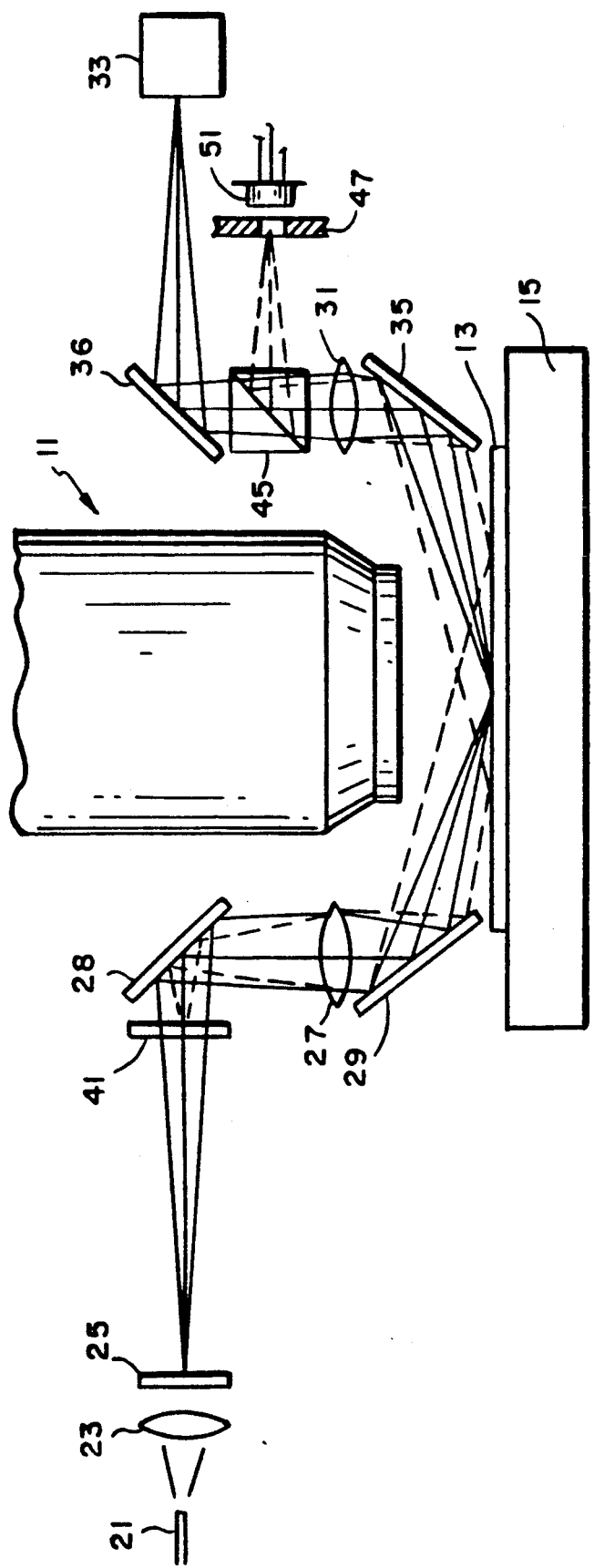
FIG. 1 is a diagram illustrating the arrangement of a combined distance and tilt sensing apparatus in accordance wit the present invention.

As indicated previously, the present invention relates to a novel tilt sensor which is combined with a distance sensor, the combined sensing apparatus being adapted for use in microlithographic apparatus in which the projection lens must closely approach a resist-coated semiconductor wafer being printed with circuit features. Referring now to FIG. 1, a microlithographic projection lens is indicated diagrammatically by reference character 11. A semiconductor wafer 13 is positioned under the lens by means of a stage apparatus which is designated generally by reference character 15. The stage apparatus allows different regions or sites on the upper surface of the wafer to be brought into alignment with the projection lens for printing. The stage mechanism typically includes transducers for effecting fine orientation adjustments of the wafer with respect to the lens both around the axis of the projection lens and also around transverse axes which are nominally parallel to the wafer surface. These latter axes are generally designated the X and Y axes whereas the vertical axis is designated the Z-axis. The transducers incorporated in the stage mechanism allow the orientation of the wafer surface to be corrected in response to position and orientation sensing signals generated by the apparatus of the present invention.

Light from a fiber optic illuminator or other suitable source 21 is projected by means of a condenser lens 23 on a slit reticle 25 which acts as an optical source object in the combined sensing apparatus disclosed herein. An image of the slit is projected onto the surface of the wafer 13 by a first imaging lens 27. The projection path is folded by means of a pair of mirrors 28 and 29 and is oriented so that the incident light approaches the surface of the wafer at a shallow or oblique angle of incidence. In one embodiment of the invention, this angle is nominally three degrees.

A second imaging lens 31 which is essentially similar to the first imaging lens 27 projects a remote image of the first object image onto a position responsive optical detector system designated generally by reference character 33, the path being again folded by respective mirrors 35 and 36. Preferably, the position responsive sensor 33 is of the scanning mirror type which converts positional displacement into timing shifts. A preferred form of such a position-responsive optical detecting apparatus is described in greater detail in copending, coassigned application Ser. No. 07/513,783 filed Apr. 23, 1990 by Glenn L. Sindledecker.

The signal generated by the position-responsive sensor 33 is essentially directly responsive or sensitive to changes in the vertical position of the wafer relative to the lens. This signal can thus be used in a servo loop which maintains the Z-axis spacing between the projection lens and the wafer at a desired value. Either the lens column or the wafer can be adjusted in vertical position to maintain the desired spacing. While the signal generated by the position-responsive sensor 33 is essentially directly responsive to changes in spacing along the Z-axis, it is essentially unaffected by small changes in the orientation of the wafer surface about the X and Y axes. As thus far described, the apparatus is essentially conventional and is adapted for forming the so-called autofocus function.

In accordance with the present invention, the same light beam which is used to obtain distance information is also used to obtain further information about the tilt of the wafer surface. A ring reticle 41 is interposed between the optical source object 25 and the imaging lens 27 at a distance along the path which is substantially equal to the focal length of the lens. Considering the reticle 41 as though it were a source, the resultant beam path beyond the imaging lens may be considered as being collimated. Further, this collimated beam may be considered as being reflected off the top surface of the wafer 13 and thence through the second imaging lens 31 so as to form an image of the ring reticle at a distance from the second lens 31 along the optical path equal to the focal length of that second lens.

The light gathered by and projected from the second imaging lens 31 is split into two paths by a beam splitter cube 45. One of the split paths proceeds to the position-responsive sensor 33 as described previously, while the other path is directed towards an aperture 47. The aperture 47 is located along the optical path at a distance from the second imaging lens 31 equal to its focal length so that its position corresponds with the projected and reflected image of the ring reticle 41 when considered as a source object.

Figure 4:
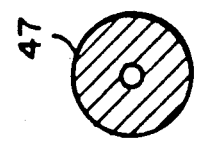
FIG. 4 is a diagram of an aperture used in the apparatus of FIG. 1.
Figure 3:
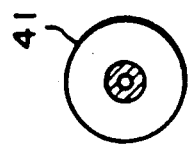
FIG. 3 is a diagram of a ring reticle used in the apparatus of FIG. 1.
Figure 2:
FIG. 2 is a drawing of a slit reticle used as an optical source object in the apparatus of FIG. 1.

The diameter of the central hole in the aperture 47 is preferably intermediate the inner and outer diameters of the opaque ring of reticle 41, i.e. as illustrated in FIGS. 3 and 4. For example, in one particular embodiment, the diameter of the aperture was two millimeters whereas the ring had a three millimeter outer diameter and one millimeter inner diameter. A position-responsive optical detector, e.g. a photosensitive bi-cell, 51 is aligned with the aperture 47. When the viewed surface of the wafer is at the desired distance from the microlithographic projection lens 11 and is level, the image of the clear center of the ring reticle 41 will be centered on the bi-cell detector 51 and thus its output will be balanced or nulled. Any tilt of the wafer surface about the horizontal axis perpendicular to the axis of the incident beam, however, will displace that central image and cause a corresponding change in the output signal from the detector 51. This output signal thus provides a means for detecting or measuring tilt of the wafer surface. While the output signal from the detector 51 is highly sensitive to tilt about that horizontal axis, it is essentially insensitive to small changes in the vertical position of the wafer, i.e. the distance from the microlithographic projection lens 11. Accordingly, it can be seen that the combined sensing apparatus of the present invention can yield essentially independent measurements of tilt and distance while utilizing a single light source and with many shared optical components. Further, the system is well adapted to be used with microlithographic systems in which the projection lens must closely approach the wafer being printed since the sensing beam approaches the wafer surface obliquely.

As indicated previously, it is typically desired to maintain the surface of the wafer perpendicular to the axis of the projection lens 11 relative to any transverse direction and thus the overall orienting system will normally include a second set of tilt measuring optics which measure or sense tilt about an axis which is transverse to the tilt axis measured by the apparatus of FIG. 1. The second optical system, however, typically will not need to include the components which are used only in the distance-sensing measurement and, likewise, the beam splitter may be omitted. As will also be understood by those skilled in the art, the two axes of measurements need not be orthogonal nor coincident with the X and Y control axes of the stage mechanism since tilt measured about any two transverse horizontal axes can be computationally resolved into tilt measurements about any other selected axes such as the x and y axes around which correcting motions may be provided.

In view of the foregoing it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. In a microlithographic system for exposing a semiconductor wafer, combined distance and tilt sensing apparatus, said apparatus comprising:
   an optical source object;
   first lens means for projecting a first image of said source object onto the surface of a wafer at a shallow angle of incidence;
   a ring reticle interposed in the optical path between said source object and said lens means at a distance from said lens means substantially equal to the focal length of the lens;
   first detector means;
   second lens means for projecting an image of said first image onto said first detector means;
   means for splitting the light projected from said second lens means into two paths;
   an aperture interposed in one of said two paths at a distance from said second lens means substantially equal to its focal length; and
   a position responsive optical detector aligned with said aperture for sensing the position of the image of the center of the ring reticle relative to the center of the aperture.

2. Apparatus as set forth in claim 1 wherein said source object is an illuminated slit.

3. Apparatus as set forth in claim 2 wherein the optical path from said slit to the surface of said wafer is folded by means of mirrors.

4. Apparatus as set forth in claim 1 wherein said first and second lens means are substantially similar.

5. Apparatus as set forth in claim 4 wherein said ring reticle comprises a clear ring with an opaque center and the aperture comprises a central circular hole having a diameter intermediate the inner and outer diameters of said ring.

6. In a microlithographic system for exposing a semiconductor wafer, combined distance and tilt sensing apparatus, said apparatus comprising:

an optical source object;

first lens means for projecting a first image of said source object onto the surface of a wafer;

a first reticle interposed in the optical path between said source object and said lens means at a distance from said lens means substantially equal to the focal length of the lens;

first detector means;

second lens means for projecting an image of said first image onto said first detector means;

an aperture interposed in the optical path from said second lens means at a distance from said second lens means substantially equal to its focal length; and a position responsive optical detector aligned with said aperture for sensing the position of the image of the center of the ring reticle relative to the center of the aperture.

7. Apparatus as set forth in claim 6 wherein said reticle comprises an opaque ring and said aperture comprises a circular hole having a diameter intermediate the inner and outer diameters of said ring.

8. In a microlithographic system for exposing a semiconductor wafer, combined distance and tilt sensing apparatus, said apparatus comprising:

means defining a slit;

means for illuminating said slit;

a first lens means for projecting a first image of said slit onto the surface of a wafer at a shallow angle of incidence;

a ring reticle interposed on axis in the optical path between said slit and said first lens at a distance from said lens substantially equal to its focal length;

first position responsive optical detector;

a second lens similar to said first lens for projecting a remote image of said first slit image onto said first detector;

means for splitting the light projected from said second lens into two paths;

an aperture interposed on axis in one of said two paths at a distance from said second lens substantially equal to its focal length; an image of the center of the ring reticle being formed on the aperture; and a second position responsive optical detector aligned with said aperture for sensing the position of the image of the center of the ring reticle relative to the center of the aperture, that position being indicative of the tilt of the surface of the wafer around an axis essentially perpendicular to the axis of the light incident on the surface.

* * * * *